MULTIFUNCTIONAL SEMICONDUCTOR DEVICES

Filed Feb. 29, 1960 2 Sheets-Sheet 1

INVENTORS
HERBERT W. HENKELS
THOMAS P. NOWALK
BY
Frederick Shapoe
ATTORNEY

MULTIFUNCTIONAL SEMICONDUCTOR DEVICES

Filed Feb. 29, 1960

2 Sheets-Sheet 2

INVENTORS
HERBERT W. HENKELS
THOMAS P. NOWALK
BY
Frederick Shapoe
ATTORNEY

United States Patent Office 3,263,138
Patented July 26, 1966

3,263,138

MULTIFUNCTIONAL SEMICONDUCTOR DEVICES

Thomas P. Nowalk, Youngwood, and Herbert Walter Henkels, Rockwood, Pa., assignors to Westinghouse Electric Corporation, East Pittsburgh, Pa., a corporation of Pennsylvania Filed Feb. 29, 1960, Ser. No. 11,686
1 Claim. (Cl. 317—235)

This invention relates to new semiconductor devices and in particular it concerns novel multifunctional single devices.

The primary object of the present invention is to provide single semiconductor devices that are actually multifunctional devices and therefore are capable of performing multiple semiconductor functions.

It is another object of the invention to provide transistor devices in which the emitter, base and collector configurations are arranged to achieve a plurality of junctions and connections in an internally cascaded structure.

A further object of the invention is to provide an audio power transistor, a unipolar power transistor and a tetrode transistor according to the foregoing objects that can be readily fabricated with known commercial techniques without extraordinarily high precision operations, and yet result in products of consistent reliability.

These and other objects are attained in accordance with our discoveries in which we provide a semiconductor device having sufficient conductivity areas of prescribed type, some of which may be interconnected by low resistance connections. In this manner, for example, we are able to provide an internally cascaded structure of NPN–NPN (or the reverse, i.e., PNP–PNP), whereupon the resulting single unit functions as would a plurality of separate transistors appropriately connected, but with fewer parts, smaller size and greater reliability. Upon practice of the present invention, it is possible to build a plurality of individual semiconductor functions into a unitary device; by giving each conductivity zone predetermined electrical characteristics, the resulting multifunctional device can be used with fewer external resistances, capacitances and the like, and therefore will have, in use, fewer points of potential failure. Such practice is one of the first true applications of molecular engineering.

The invention will be most readily understood by considering its description in conjunction with the attached drawing in which.

Figure 1:
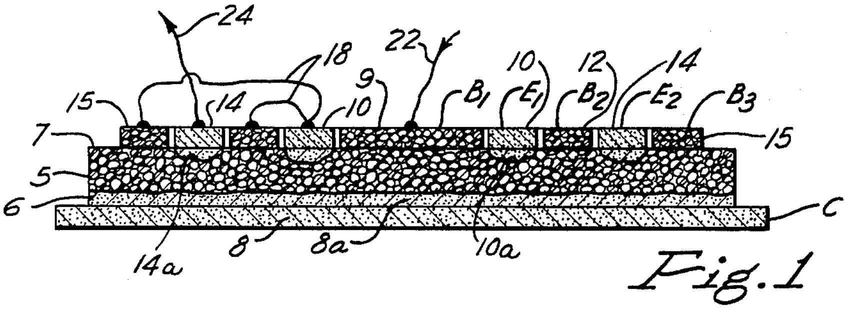
FIG. 1 is a side view showing the relative disposition of the various elements as well as indicating the relative conductivity of the several zones in a semiconductor device, such as a transistor, in accord with the invention.
Figure 7:
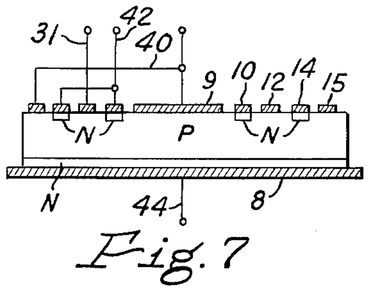
Figure 5:
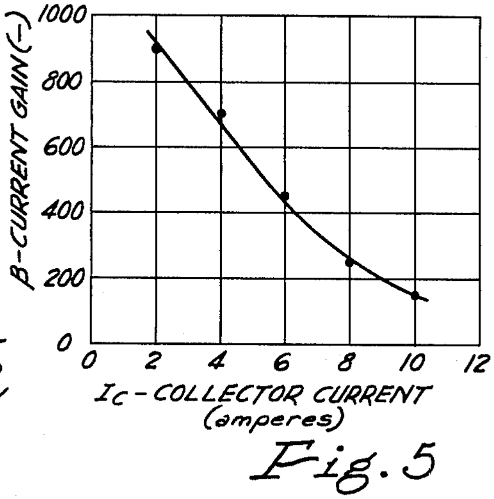
Figure 6:
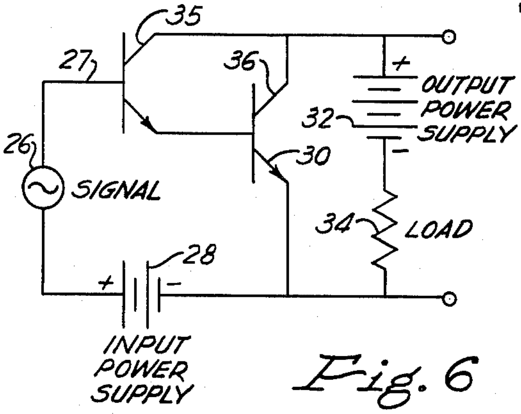

FIG. 5 graphically illustrates a typical common emitter current gain ($\beta$) with a device of this invention;

FIG. 6 illustrates in schematic form the device of FIG. 1 utilized as an amplifier; and, FIG. 7 is a sectional view of a tetrode device in accordance with this invention.

Referring now to FIG. 1, the numeral 5 indicates a body of semiconductor material containing conductivity determining impurities in a concentration sufficient to characterize the semiconductor as being of one conductivity type. The semiconductor shown is shaped as a thin circular wafer, and accordingly has opposed major surfaces 6 and 7. On its lower surface 6 is a foil 8 comprising an electrode material containing conductivity type impurities of a type opposite to those contained in the semiconductor body 5. Electrode 8 is the collector electrode of a transistor device of the invention; it generally is relatively large to dissipate the large amount of heat developed as a consequence of the high currents involved in some uses of the device. The electrode and semiconductor body are fused together; accordingly, a P–N junction is produced in the semiconductor material adjacent the electrode foil 8, because the fusion of the foil produces a zone **8*a*** in the semiconductor body of opposite conductivity type.

On the upper surface 7 of the semiconductor body 5 is a first base electrode 9 composed of an electrode material that is doped with a conductivity impurity of the type that determines the conductivity of the semiconductor material 5. Annularly spaced about the base electrode 9 is a ring-shaped first emitter electrode 10, composed of an electrode material that is doped with a conductivity type impurity opposite that of the semiconductor 5.

A second base electrode 12, ring shaped, is spaced about the first emitter electrode, and a second emitter electrode 14 is annularly disposed with respect to base 12. Finally, a third base electrode 15, ring shaped, is on surface 7 about the second emitter 12. The second and third base electrodes are doped with conductivity determining impurities of the same type as the semiconductor 5 while the emitter electrodes are doped with the opposite type conductivity determining impurities. The emitter electrodes are in broad-area rectifying contact with the semiconductor 5, while the base electrodes are in non-rectifying contact therewith. Accordingly, second and third P–N junctions **10*a* and 14*a* are provided in the zones of the semiconductor under the emitter electrodes 10 and 14 respectively. A bridge conductor 18 extends from the first emitter electrode 10 to base electrode 12 as well as to base electrode 15, the latter instance being where the third base electrode is used. An input lead 22 is attached to the first base electrode 9 while an output lead 24 extends from emitter electrode 14**.

Figure 3:
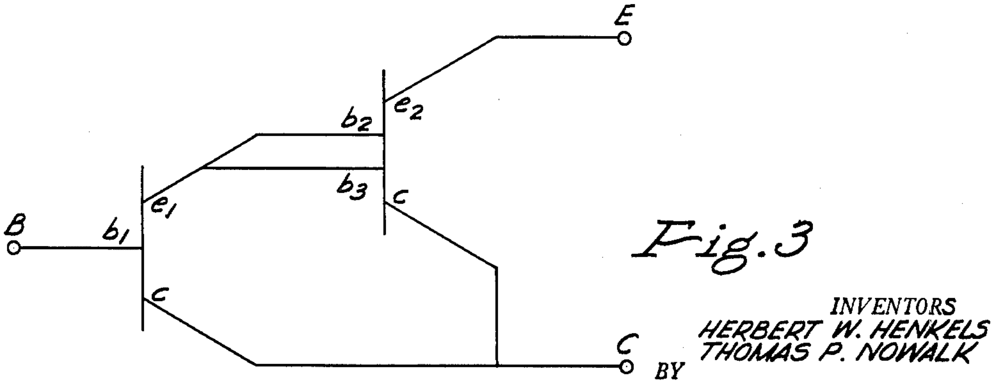
FIG. 3 illustrates the equivalent diagram of the device of FIG. 1.

Semiconductor devices, such as transistors, of the present invention lend themselves to ready fabrication in an economical manner. A convenient procedure for producing such a device is as follows: A silicon wafer containing P-type impurities (e.g. boron) as the significant conductivity determining impurities is placed on a gold alloy foil containing N-type impurities as the predominant conductivity impurity constituent. This gold alloy foil and those hereinafter designated as emitter foils can all have the same composition, for example, 0.6 weight percent of antimony and the remainder gold where it is desired to simplify engineering considerations. Of course, different concentrations as well as different conductivity determining impurities could be used in each, if desired. Centrally on the upper surface of the silicon wafer is placed the first base electrode, which is a P-doped gold alloy, for example, 0.3 weight percent of boron, or other P-type impurity, and the remainder gold. A first ring-shaped emitter electrode is placed about the first base electrode. Then a second base electrode, of annular configuration, is placed around the first emitter electrode. A second emitter electrode is placed around the second base electrode and the final base electrode is then annularly disposed with respect to the second emitter. The resulting sandwich, held together by a suitable clamp, is then inserted in a furnace and the temperature is raised sufficiently to fuse the electrode foils to the silicon wafer. The electrodes fuse to the silicon at a temperature below the melting point of the silicon. During the fusion, the surface portion of the silicon wafer adjacent each electrode creates an impurity-rich alloy melt, the impurity being that from the electrode. It will be appreciated that the impurity concentration in the silicon must be of a value such that the conductivity impurity in the collector and emitter electrodes will be dominant in the alloy formed. When the impurity-rich alloy melt of the emitter and collector electrodes cools and freezes, silicon of a conductivity type opposite to that of the wafer itself is recrystallized out of the melt to form a zone of opposite conductivity silicon; the interfaces between such zones and the unchanged body of semiconductor are P–N junctions. The recrystallized silicon at the base electrode is, of course, of the same type conductivity as that of the silicon wafer. Hence, the very act of joining the electrodes and the semiconductor body into a single structural device produces the necessary conductivity characteristics in the resulting device simultaneously. Thereafter, the external leads are attached; the connections, if any are used, from the first emitter to the second and third base electrodes conveniently are made by brazing a conventional bridge to them. The equivalent diagram of the resulting structure is shown in FIGURE 3.

FIGURE 6 shows the use of a structure as just described, with the device being shown as its equivalent diagram, as a simple amplifier. Thus, a signal from a source 26 is fed into the base 27 of the first transistor. An input power supply 28 is placed across input base 27 and output emitter 30 and provides the bias. An output power supply 32 across the output emitter 30, through an appropriate load 34, and the collector electrodes 35 and 36 (actually a single electrode) provides the collector bias. It is apparent that the same transistor could be used in other circuits and for other purposes, for example as an oscillator.

A specific example of a transistor that is structurally in accord with that shown in FIGURE 1 was made as follows: The collector, emitter and base electrodes were made from foils 0.0015 in. thick. The collector foil was generally circular and had a diameter of 0.551 in. The silicon wafer used was boron doped and therefore P-type; its characteristics were a (111) orientation, a 50 to 150 ohm-cm. resistivity and a 200 microseconds lifetime. The silicon wafer was 0.0043 inch thick and had a diameter of 0.500 inch. The first base electrode was circular and had a diameter 0.110 inch. The first emitter electrode had an inside diameter of 0.119 inch and an outside diameter of 0.188 inch. The first ring-shaped base electrode had an inside diameter of 0.197 inch and an outside diameter of 0.276 inch. The second emitter electrode had an inside diameter of 0.285 inch and an outside diameter of 0.363 inch. The second ring-shaped base electrode had an inside diameter of 0.372 inch and an outside diameter of 0.449 inch. All base electrodes were nominally composed of 0.3 weight percent of boron and the balance gold, while the collector and two emitter electrodes had a nominal composition of 0.6 percent of antimony and the remainder gold. The electrodes were fused to the silicon wafer by heating the sandwich at about 700° C. and holding at temperature for about two minutes whereupon the sandwich was permitted to cool to room temperature. The first emitter ring was connected to the ring-shaped base electrodes by brazing gold plated silver bridges thereto at about 400° C. Leads in non-rectifying contact are made with the first base electrode and the second emitter electrode to serve as the input and output leads respetcively.

A plurality of transistors were made according to the foregoing example. A large group of them were tested and the data obtained were studied. The diode characteristics were determined. Collector-base voltages at 1 milliampere current, the collector-emitter voltages (with $V_{eb}=0$) at 1 milliampere and at 10 milliampere current and emitter-base voltages at 10 milliamperes were recorded. Characteristically, the leakage currents were of the order of 0.1 milliampere. At 1 milliampere, the collector-emitter voltages ranged from 60 to 255 volts. The collector base ratings were higher and ranged from 165 to over 300 volts. One third of the units exhibited diode voltages in excess of 300 volts. Emitter-base voltages were generally about 100 volts at the 10 milliampere level. It should be noted that the foregoing data were taken at room temperature.

The input characteristic, common emitter, of a typical unit from data at input current up to 10 milliamperes and with a collector voltage parameter of zero and 5 volts, was determined. At zero collector voltage, low current values approximated 50 ohms; the high current values were about 20 ohms; at collector voltages of 5 volts, the values were 250 ohms and 80 ohms respectively.

Figure 4:
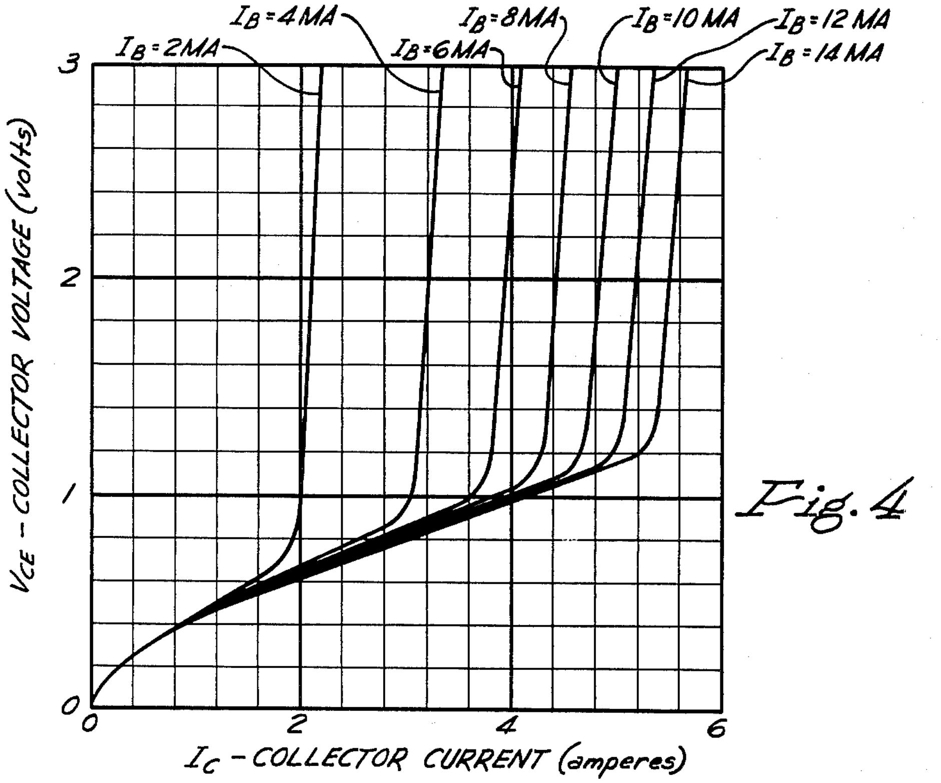
FIG. 4 illustrates in graphical form the common emitter output characteristics of a device of the invention.

The output characteristic of a typical unit in the common emitter and common base configurations was determined through curves developed from data taken on an American Electronics Transistor Tester. FIGURE 4 shows curves of the common emitter characteristic. D.C. current gain ($\beta=I_c/I_b$) is taken at $V_{CE}=3$ volts. A beta of about 500 is evidenced at a collector current of 5 amperes. The A.C. current gain is lower, as expected, being for the case illustrated about 200 at 5 amperes.

These data make it evident that only a low current input is required to drive the transistor to high output currents. Consequently, the device can operate from a very low power source. Assuming an input resistance of about 300 ohms and a base drive of 10 milliamperes, a power supply rated at about 30 milliwatts is capable of controlling an output of 500 watts. This is equivalent of the remarkable power gain of greater than 15,000.

In FIGURE 5, an approximate curve of current gain has been provided on units of the type described in the specific example above. In some units, peak betas of considerably over 2,000 were found. As noted previously, the current gain at 5 amperes is about 500; at 10 amperes, the current gain is still about 150. The power gain at 5 amperes in the switching mode is about 43 decibels.

From the foregoing data, it is evident that a high gain power transistor is provided by the present invention. The unique characteristics of the resulting device, shown above on experimental samples on which no systematic optimization was applied, are evidence of the promise that devices of the present invention provide. One functional result of this invention is a power transistor with an output range in amperes that is capable of operation from input sources of but several milliamperes. Practical considerations show the advantages of fewer parts, less expense and greater reliability by providing multifunctional in accordance with these discoveries.

The high gain power transistors of the invention are particularly useful for audio frequency applications. For example, such transistors can be used in high fidelity and regular fidelity record players, as well as in voice circuits, in television circuits and in similar applications. Actual use has been demonstrated successfully in high fidelity equipment.

Figure 2:
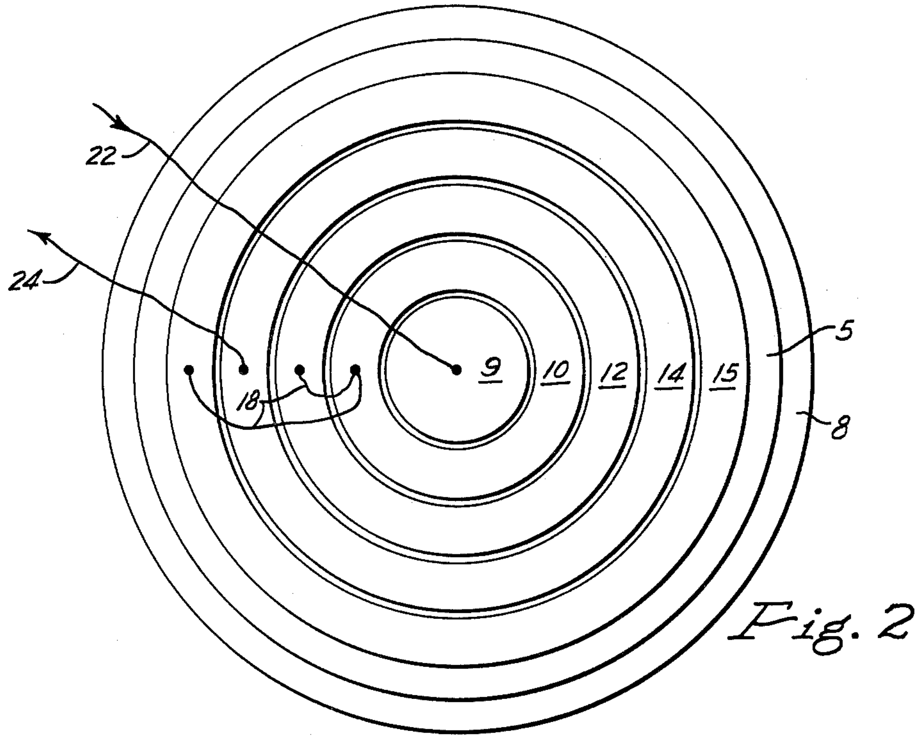
FIG. 2 is a top view of the device of FIG. 1.

Variations from the foregoing specific example can be made without departing from the scope of this invention. For example, in place of the ring configurations of the emitter and base electrodes, electrode dots or rectangular or other shaped electrodes can be used. Moreover, the collector and emitter junctions can be on the same surface of the semiconductor wafer where the design considerations of the intended applications permit it. The third base electrode is not essential to the internally cascaded structure and can be omitted where the resultant loss of current gain, due to decreased emitter edge length, is satisfactory for any reason. Where that base electrode is omitted, the bridge connection between it and the first emitter is also unnecessary and is omitted. Electrodes as the physical entities disclosed above also can be omitted where it is desired to provide other type structure or other type junctions, i.e. such as diffused or grown junctions, for any reason. For example, for very thin conductivity zones it may be desirable to provide them through diffusion techniques rather than as shown above. Similarly, it will be appreciated that the conductivity characteristics disclosed can be reversed and that other P and N type impurities, other electrode materials and other semiconductor materials can be used if desired while taking advantage of the discoveries constituting the invention.

Where it is desired to eliminate any external connections to interconnect the various zones, the use of shapes other than ring-shape may be more convenient. For example the rectangular shaped electrodes could be used. The same result actually has been accomplished with the ring configuration. In the example discussed, that would be accomplished by placing base electrode 12 so close to emitter electrode 10 that they short together upon fusion. Simultaneously a section of emitter electrode 14 is omitted, and a low resistance path free from P–N junctions is provided on the surface of semiconductor wafer 5 between base electrodes 12 and 15. In that fashion, the bridge 18 (FIGS. 1 and 2) is omitted entirely.

Variations in application can also be made in the disclosed structure of the device without departing from the scope of the invention. For example, a unipolar power transistor can be obtained by simply changing the bridging or interconnection scheme. This is best explained with reference to FIGURE 1. For example, a non-rectifying contact (or lead) is made to the ohmic eletcrode 12. A second non-rectifying contact is made, in common, to the ohmic electrodes 9 and 15. A third non-rectifying contact is made, in common, to the junction electrodes 8, 10, and 14. In this manner, the drain, source and gate electrodes, respectively, of a unipolar transistor are defined. Optimization of the structure for this purpose requires that the gate electrodes 10 and 14 be of narrow width.

Another application of the basic structure within the scope of this invention provides a tetrode transistor as illustrated in FIG. 7. The device of FIG. 7 is like that illustrated in FIG. 1 but has a different arrangement of leads and interconnections between the electrodes. A non-rectifying contact 38 (or lead) is made to the ohmic electrode 12. A second non-rectifying contact 40 is made, in common, to the ohmic electrodes 9 and 15. A third non-rectifying contact 42 is made, in common, to the junction electrodes 10 and 14. A fourth non-rectifying contact 44 is made to the junction electrode 8. In this manner, the first and second base, the emitter and the collector electrodes, respectively, of a tetrode transistor are defined. Optimization of the structure for this purpose requires that emitter electrodes 10 and 14 be of narrow width. It will be appreciated that the contacts indicated for the unipolar and tetrode transistors can be integral with the electrodes associated therewith in the description. The foregoing manner of expression is simply to insure clarity and is not to be construed as limiting the invention.

In accordance with the provisions of the patent statutes, the present invention has been illustrated and described with what is now conceived to represent its best embodiment. However, it should be understood that the invention can be practiced otherwise than as specifically described and illustrated.

We claim as our invention:

A transistor comprising a unitary body of semiconductor material of one conductivity type having spaced major surfaces, a collector electrode containing opposite type conductivity determining impurities fused to one of said major surfaces and producing in said body a fused P-N junction, a first base electrode fused in non-rectifying contact with the other of said major surfaces of said semiconductor body, a first ring-shaped emitter electrode containing opposite type conductivity determining impurities spaced from and surrounding said first base electrode and fused to and producing in said body at P-N junction, a first ring-shaped base electrode spaced about said first emitter electrode and fused to said semiconductor body in non-rectifying contact, a second ring-shaped emitter electrode containing opposite type conductivity determining impurities spaced about said first ring-shaped base electrode and fused to said semiconductor body and producing said body a P-N junction, a second ring-shaped base electrode spaced about said second emitter electrode and fused to said semiconductor body in non-rectifying contact, a first lead bridged to said first base electrode and said second ring-shaped base electrode, a second lead bridged to said first and second emitter electrodes, a third lead to said first ring-shaped base electrode, said third lead being separate from said first lead and a fourth lead to said collector electrode to provide a tetrode transistor.

References Cited by the Examiner

UNITED STATES PATENTS

| | | | |
|---|---|---|---|
| 2,897,295 | 7/1959 | Zelinka | 317—235 |
| 2,924,760 | 2/1960 | Herlet | 317—235 |
| 2,985,804 | 5/1961 | Buie | 317—235 |
| 3,029,366 | 4/1962 | Lehovec | 317—235 |
| 3,046,405 | 7/1962 | Emeis | 317—235 |
| 3,051,877 | 8/1962 | Maupin | 317—235 |

JOHN W. HUCKERT, *Primary Examiner.*

LLOYD McCOLLUM, SAMUEL BERNSTEIN, JAMES KALLAM, *Examiners.*

DAVID G. GALVIN, A. S. KATZ, A. B. GOODALL, J. D. CRAIG, *Assistant Examiners.*